United States Patent
Jones et al.

(10) Patent No.: US 11,257,940 B2
(45) Date of Patent: Feb. 22, 2022

(54) GROUP III HEMT AND CAPACITOR THAT SHARE STRUCTURAL FEATURES

(71) Applicant: Cree, Inc., Durham, NC (US)

(72) Inventors: Evan Jones, Durham, NC (US); Jeremy Fisher, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/741,835

(22) Filed: Jan. 14, 2020

(65) Prior Publication Data

US 2021/0217883 A1    Jul. 15, 2021

(51) Int. Cl.
*H01L 29/778* (2006.01)
*H01L 49/02* (2006.01)
*H01L 29/45* (2006.01)
*H01L 29/92* (2006.01)

(52) U.S. Cl.
CPC .......... *H01L 29/7783* (2013.01); *H01L 28/40* (2013.01); *H01L 29/452* (2013.01); *H01L 29/92* (2013.01)

(58) Field of Classification Search
CPC ... H01L 29/7783; H01L 29/452; H01L 29/92; H01L 28/40
See application file for complete search history.

(56) References Cited

U.S. PATENT DOCUMENTS

| | | |
|---|---|---|
| 5,409,846 A | 4/1995 | Hirose |
| 2003/0092239 A1 | 5/2003 | Coolbaugh et al. |
| 2008/0290371 A1 | 11/2008 | Sheppard et al. |
| 2014/0091311 A1 | 4/2014 | Jeon et al. |
| 2014/0091845 A1 | 4/2014 | Then et al. |
| 2016/0086938 A1* | 3/2016 | Kinzer ............... H01L 27/0629 257/76 |
| 2020/0044032 A1* | 2/2020 | Haeberlen .......... H01L 29/7787 |

FOREIGN PATENT DOCUMENTS

JP    2016195195 A    11/2016
WO    3154193 A1    4/2017

* cited by examiner

*Primary Examiner* — Syed I Gheyas
(74) *Attorney, Agent, or Firm* — Coats & Bennett, PLLC

(57) ABSTRACT

A High Mobility Electron Transistor (HEMT) and a capacitor co-formed on an integrated circuit (IC) share at least one structural feature, thereby tightly integrating the two components. In one embodiment, the shared feature may be a 2DEG channel of the HEMT, which also functions in lieu of a base metal layer of a conventional capacitor. In another embodiment, a dialectic layer of the capacitor may be formed in a passivation step of forming the HEMT. In another embodiment, a metal contact of the HEMT (e.g., source, gate, or drain contact) comprises a metal layer or contact of the capacitor. In these embodiments, one or more processing steps required to form a conventional capacitor are obviated by exploiting one or more processing steps already performed in fabrication of the HEMT.

29 Claims, 9 Drawing Sheets

GROUP III HEMT AND CAPACITOR THAT SHARE STRUCTURAL FEATURES

FIELD OF INVENTION

The present invention relates generally to integrated circuits, and in particular to a HEMT and a capacitor co-formed on an integrated circuit, wherein the two components share one or more structural features.

BACKGROUND

A High Electron Mobility Transistor (HEMT) is a type of Field Effect Transistor (FET) having a low noise figure at microwave frequencies. HEMTs are used in Radio Frequency (RF) circuits, as both digital switches and current amplifiers, where high performance is required at very high frequencies. HEMTs employ a heterojunction—a junction between materials with different band gaps. HEMTs have been fabricated with several materials, including Silicon (Si); Gallium Arsenide (GaAs) and Aluminum Gallium Arsenide (AlGaAs); and Gallium Nitride (GaN) and Aluminum Gallium Nitride (AlGaN).

Si has a relatively low electron mobility (e.g., 1450 $cm^2/V\text{-}s$). This produces a high source resistance, which limits the HEMT gain. GaAs has a higher electron mobility (e.g., 6000 $cm^2/V\text{-}s$), and hence lower source resistance, allowing for higher gain at high frequencies. However, GaAs has a bandgap of only 1.42 eV at room temperature, and a small breakdown voltage, which limits high power performance at high frequencies.

Group III nitrides have a larger bandgap as compared to these other semiconductor materials and are thereby suitable for higher power and higher frequency applications. While GaN is of particular interest, in general, a Group III nitride heterojunction for a HEMT may be formed from a binary, ternary, or quaternary alloy of Group III metals and Nitrogen. This formulation may be expressed as $Al_xIn_yGa_{1-x-y}N$, where $0<=x<=1$ and $0<=y<=1$—that is, any combination of some or all of Aluminum, Indium, and Gallium alloyed with Nitrogen. In particular, the density of the various alloys may be altered to control the properties of the semiconductor. For example, Aluminum increases the bandgap of GaN, while Indium reduces it.

GaN has a bandgap of 3.36 eV and a relatively high electron mobility (e.g., 2019 $cm^2/V\text{-}s$). GaN HEMTs thus offer high power and high temperature operation at high frequencies, making them well suited for applications in wireless telecommunications, RADAR, defense, and other applications. In a GaN HEMT, a heterojunction is formed at the boundary of layers of GaN and, e.g., AlGaN. As used herein, AlGaN is an abbreviation for the formula $Al_xGa_{1-x}N$, $0 \leq x < 1$, meaning the concentration of Al in the alloy may be varied. Layers of AlGaN may also be graded, with the concentration of Al atoms in the lattice varying as a function of depth.

At the heterojunction between GaN and AlGaN layers, the difference in bandgap energies between the higher bandgap AlGaN and the GaN creates a two-dimensional electron gas (2DEG) in the smaller bandgap GaN, which has a higher electron affinity. The 2DEG has a very high electron concentration. Additionally, the Al content in the AlGaN layer creates a piezoelectric charge at the interface, transferring electrons to the 2DEG in the GaN layer, enabling a high electron mobility. For example, sheet densities in the 2DEG of a AlGaN/GaN HEMT can exceed $10^{13}$ $cm^{-2}$. The high carrier concentration and high electron mobility in the 2DEG create a large transconductance, yielding high performance for the HEMT at high frequencies.

In practical applications, GaN HEMTs require additional circuits, comprising various components such as capacitors, inductors, and resistors. For example, HEMTs employed as amplifiers generally require RF filters at the amplifier input, output, or both, to optimize operation of the amplifier in desired frequency ranges, provide impedance matching to connected circuits, and the like. As another example, U.S. patent application Ser. No. 16/358,985 discloses the use of shunt capacitors to reduce an imbalance in parasitic capacitance between amplifiers in an asymmetric Doherty amplifier circuit. As yet another example, U.S. patent application Ser. No. 16/421,999 discloses the use of DC blocking capacitors to isolate an impedance inverter with integrated harmonic termination (which also employs capacitors) from the amplifiers of a Doherty amplifier circuit. In short, capacitors are often (if not usually) required to make useful circuits based on GaN HEMTs. Accordingly, efficient and effective capacitor construction on integrated circuits is of interest for optimizing many IC circuits, including those employing GaN HEMTs. Additionally, simplifying the fabrication of integrated circuits, and increasing their yield and reliability, leads to cost reduction and higher integration.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a High Mobility Electron Transistor (HEMT) and a capacitor co-formed on an integrated circuit (IC) share at least one structural feature, thereby tightly integrating the two components. In one embodiment, the shared feature may be a 2DEG channel of the HEMT, which also functions in lieu of a base metal layer of a conventional capacitor. In another embodiment, a dialectic layer of the capacitor may be formed in a passivation step of forming the HEMT. In another embodiment, a metal contact of the HEMT (e.g., source, gate, or drain contact) comprises a metal layer or contact of the capacitor. In these embodiments, one or more processing steps required to form a conventional capacitor are obviated by exploiting one or more processing steps already performed in fabrication of the HEMT. In yet another embodiment, a conventional capacitor is formed over the capacitor sharing structural features, increasing capacitive density without increasing IC area.

One embodiment relates to an integrated capacitor and High Electron Mobility Transistor (HEMT) co-formed on an integrated circuit. The combination comprises a capacitor comprising at least the structural features of a base conductive layer; a dielectric layer over the conductive layer; and an upper conductive layer over the dielectric layer. The combination further comprises a HEMT comprising at least the structural features of a channel epitaxial layer; a barrier epitaxial layer on the channel layer, the barrier layer having a higher bandgap than the channel layer, whereby a Two-Dimensional Electron Gas (2DEG) is formed in the channel epitaxial layer at a heterojunction with the barrier layer; a passivation layer on the barrier layer, the passivation layer selectively removed to expose selected portions of the barrier layer; and first, second, and third ohmic contacts formed over three of the exposed portions of the barrier layer. The first, second, and third ohmic contacts are source, gate, and drain contacts of the HEMT, and a first region of the 2DEG is a channel of the HEMT. The capacitor and the HEMT share at least one structural feature.

Another embodiment relates to a HEMT and a capacitor co-formed on an integrated circuit. The co-formed HEMT/capacitor includes a channel layer and a barrier layer on the channel layer. The barrier layer has a higher bandgap than the channel layer, whereby a 2DEG is formed in the channel layer at a heterojunction with the barrier layer. The co-formed HEMT/capacitor further includes a first dielectric layer on the barrier layer. The first dielectric layer is selectively removed to expose selected portions of the barrier layer. First, second, and third ohmic contacts are formed over three of the exposed portions of the barrier layer, wherein the first, second, and third ohmic contacts are source, gate, and drain contacts of the HEMT, and wherein a first region of the 2DEG is a channel of the HEMT. A fourth ohmic contact is formed over an exposed region of the barrier layer, wherein the fourth ohmic contact and a second region of the 2DEG are a first terminal of the capacitor. A fifth ohmic contact is formed over a non-exposed region of the dielectric layer over the second region of the 2DEG, wherein the fifth ohmic contact is a second terminal of the capacitor.

Yet another embodiment relates to a method of co-forming a HEMT and a capacitor on an integrated circuit. A semiconductor epitaxial channel layer is deposited. A semiconductor epitaxial barrier layer is deposited on the channel layer. The barrier layer has a higher bandgap than the channel layer, whereby a 2DEG is formed in the channel layer at a heterojunction with the barrier layer. At least a first dielectric layer is deposited on the barrier layer. The first dielectric layer is etched to expose the barrier layer in selected areas. Metal is deposited over first, second, and third exposed areas over a first region of the 2DEG to form source, gate, and drain contacts of the HEMT, wherein the first region of the 2DEG is a channel of the HEMT. Metal is deposited over a fourth exposed area over a second region of the 2DEG to form a first contact of a capacitor, wherein the second region of the 2DEG electrically connects to the first capacitor contact. Metal is deposited over an unexposed area of the first dielectric layer over the second region of the 2DEG to form a second contact of the capacitor. The second contact is separated from the second region of the 2DEG by the dielectric layer, and thereby forms a capacitor.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

Figure 1:
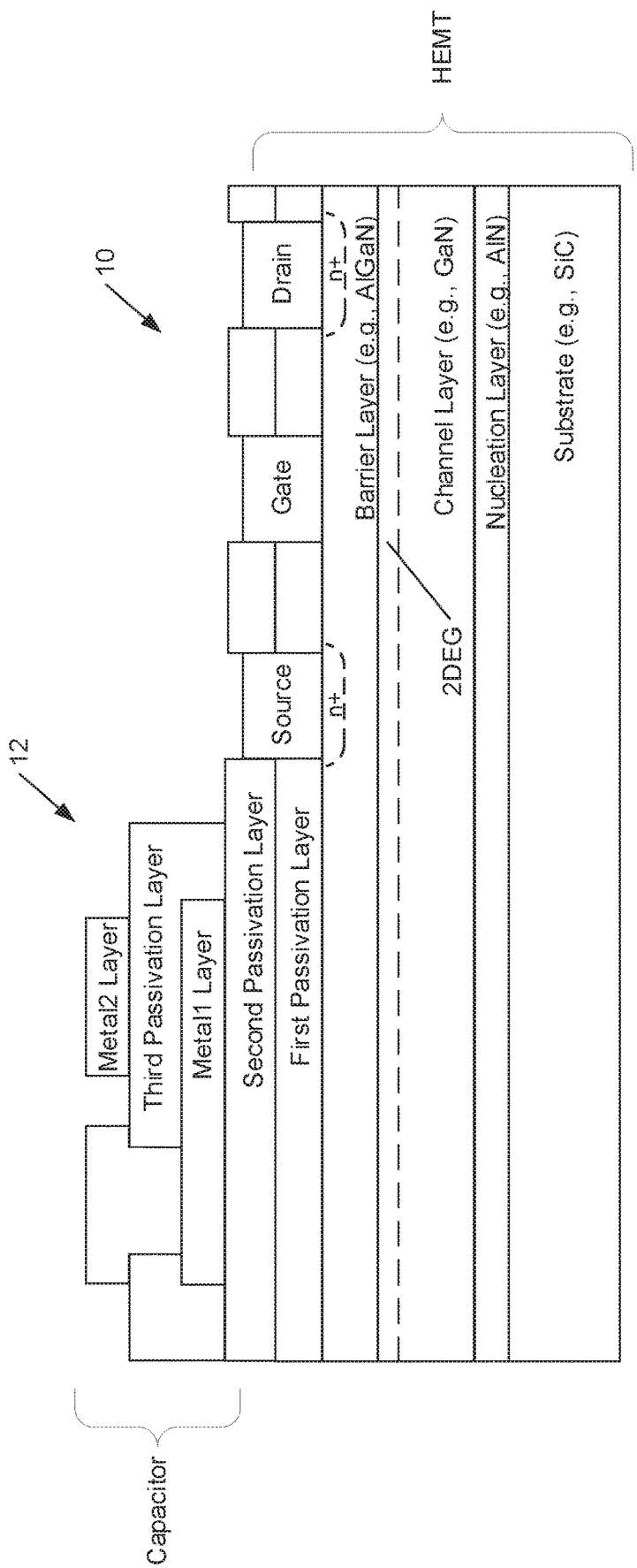
FIG. 1 is a section view of a conventional capacitor formed next to a HEMT on an integrated circuit.

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Furthermore, the various layers and regions illustrated in the figures are illustrated schematically. Accordingly, embodiments of the present invention are not limited to the relative size, spacing, and alignment illustrated in the accompanying figures. As used herein, a semiconductor layer described as being "on" a substrate or other layer may refer to the layer formed directly on the substrate or other layer, or on an intervening layer or layers formed on the substrate or other layer. As used herein, a semiconductor layer described as being "directly on" another layer means the two layers share an interface—that is, there is no intervening layer between the two. As used herein, references to a structure or feature that is disposed "adjacent" another feature may have portions that overlap or underlie the adjacent feature.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 depicts a GaN HEMT 10, with a conventional capacitor 12 formed on the same integrated circuit. The GaN HEMT 10 includes a substrate, formed for example from Silicon Carbide (SiC). An optional nucleation layer may be deposited over the substrate, for example formed from Aluminum Nitrate (AlN). A channel layer of GaN is deposited over the nucleation layer (or alternatively directly on the substrate). A barrier layer is deposited directly on the channel layer. The barrier layer may comprise, e.g., GaN doped with Aluminum (AlGaN). At the boundary of the channel layer and barrier layer, or the heterojunction, a 2DEG is formed. The 2DEG provides a channel for conduction between a source terminal and drain terminal, in dependence on the voltage on a gate terminal. Implant regions in the upper surface of the barrier layer are doped with an n-type material, to facilitate electric connectivity between the source and drain terminals and the 2DEG, or the HEMT 10 channel. Those of skill in the art will appreciate that the diagram of FIG. 1 only represents the essential features of a HEMT; any actual HEMT circuit may include additional features, such as passivation layers, field plates, and the like.

To form the conventional capacitor 12, after the HEMT 10 channel and barrier layers are formed, a first passivation layer is deposited over the barrier layer. The gate, source, and drain ohmic contacts are then formed in the barrier layer, such as by doping locally with a n+ type dopant. Isolation of the HEMT channel from other structures optimizes control of the HEMT. The gate, source, and drain terminals are formed, and metal is deposited to form the contacts. Another passivation layer may be deposited (not shown), for example to isolate the gate terminal from field plate metallization (not shown).

To form the capacitor 12, a base layer of metal, such as Gold (denoted Metal1 in the FIG. 1), is deposited on the first passivation layer. A dielectric, or insulating, layer is then formed over the base metal layer in a second passivation step, and a portion of it is etched away to expose the base metal layer. In a second metallization step, a first metal contact may be formed over the dielectric, and a second metal contact may be formed over the exposed base metal layer, making a conductive contact with the underlying first base metal layer. These two contacts then form the two connections to the capacitor, with the dielectric layer separating one metal contact from the base metal layer. Those of skill in the art will appreciate that the capacitor 12 may be constructed using different geometries.

The base metal layer is typically formed by evaporation, and requires additional processing steps. For example, a mask material may be deposited, and etched away where the base metal layer is to be formed. The source material (e.g., Gold) is vaporized in a vacuum, and sent through a vacuum tube to the IC wafer, where the material lands and condenses back into a solid state, forming the base metal layer. The deposition rate is determined by the pressure and temperature in the furnace, as well as the atomic mass of the material to be deposited. The mask material around the base metal layer may then be removed.

At least one dielectric layer is then deposited over the base metal layer, and a portion of the dielectric layer, over the base metal layer, is etched away to expose the base metal layer. In a second metallization process step (requiring a second mask and etch process), the contacts are formed. One contact may be formed over the etched portion of the dielectric layer, making direct electrical contact with the base metal layer. The other contact is formed over the dielectric layer (also over the base metal layer). These two contacts form the connections to the capacitor, which is formed between the two metal layers separated by the dielectric layer.

While evaporation is a popular method for depositing metals due to its cost effectiveness and overall simple process, the resulting base metal layer is susceptible to defects related to the evaporation process. In particular, clumps of metal often form, known as Gold spits or nodules, which may cause a short-circuit in the capacitor. Another known defect of a base metal layer in a capacitor is rough morphology, which can cause early dielectric breakdown. These defects reduce the reliability of capacitors formed on integrated circuits, reducing overall yield and hence raising costs. Additionally, the process steps of forming two metal layers (and concomitant mask layers), with an intervening dielectric layer, add to the overall processing required to fabricate the integrated circuit.

Figure 2:
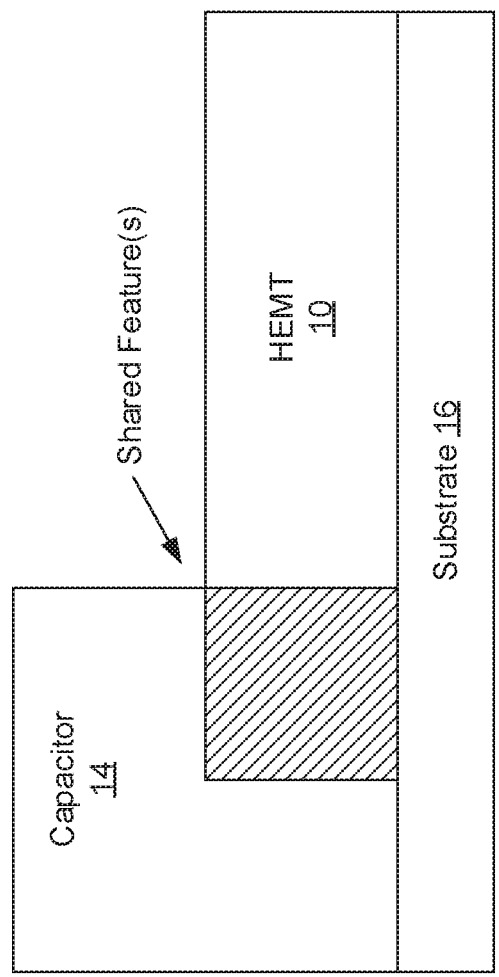
FIG. 2 is a block diagram showing shared features between a capacitor and HEMT on an integrated circuit.

According to embodiments described and claimed herein, a HEMT and a capacitor are co-formed on an integrated circuit, and share at least one structural feature. FIG. 2 depicts this concept in block diagram form. A HEMT 10 and capacitor 14 are both formed on the same IC, as indicated by both circuits 10, 14 residing on the same substrate 16. At least one structural feature—e.g., a conductive channel, metal contact, passivation layer, etc.—is shared between the two. That is, at least one shared structural feature forms an element of both the HEMT 10 and the capacitor 14. This integration of the HEMT 10 and capacitor 14 may obviate one or more processing steps, improving the manufacturing process.

In one embodiment, the shared feature may be a 2DEG channel of the HEMT, which also functions in lieu of a base metal layer of a conventional capacitor. In another embodiment, an epitaxial layer of the HEMT may provide the conductivity to function in lieu of a base metal layer of the capacitor, and may be doped to enhance that conductivity. In yet another embodiment, a dialectic layer of the capacitor may be formed in a passivation step of forming the HEMT. In still another embodiment, a metal contact of the HEMT (e.g., source, gate, or drain contact) comprises a metal layer or contact of the capacitor. In these embodiments, one or more processing steps required to form a conventional capacitor are obviated by exploiting one or more processing steps already performed in fabrication of the HEMT.

Figure 3:
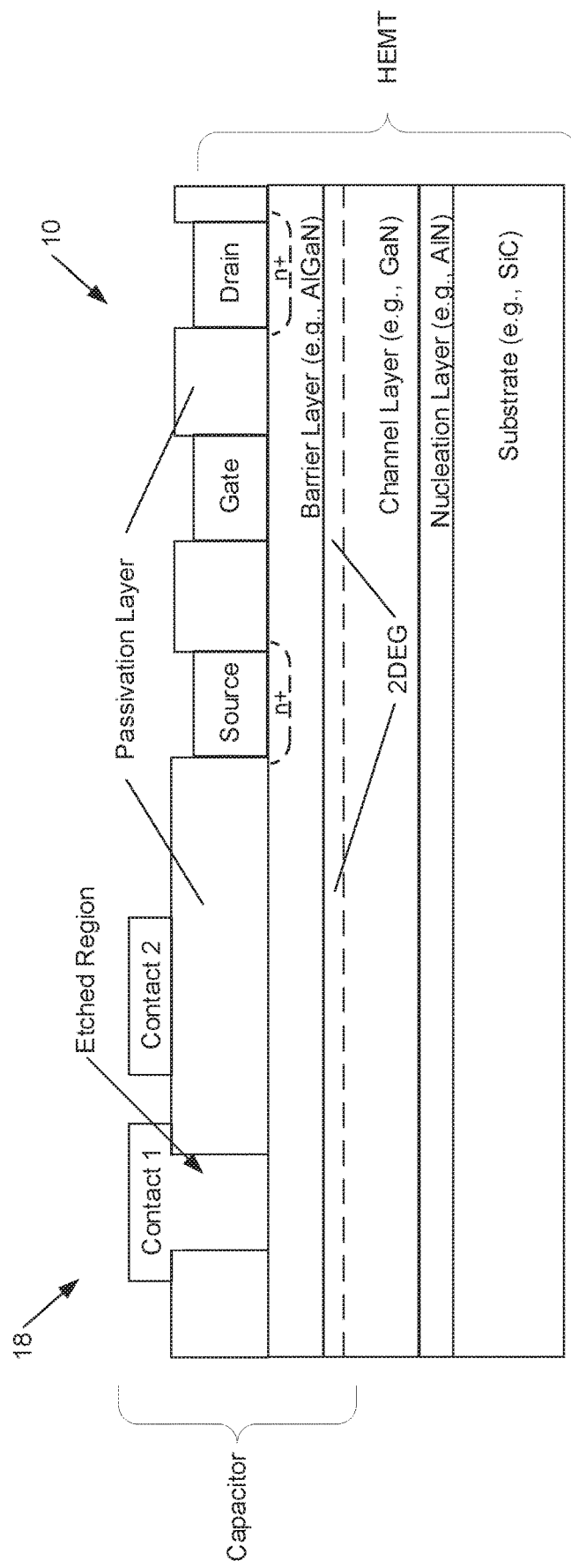
FIG. 3 is a section view of an HEMT and capacitor co-formed on an integrated circuit, utilizing a 2DEG as a conductive region of the capacitor in lieu of a base metal layer.

FIG. 3 depicts a capacitor 18 according to one embodiment of the present invention, co-formed on an integrated circuit alongside the GaN HEMT 10, wherein two features are shared between the components 10, 18—the HEMT 2DEG functions as the base metal layer of the capacitor 18, and a passivation layer deposited in the fabrication of the HEMT 10 functions as the dielectric layer of the capacitor 18. In this embodiment, the highly conductive 2DEG formed at the heterojunction between the channel layer (e.g., GaN) and barrier layer (e.g., AlGaN)—which serves as the channel to the HEMT 10—functions as the base metal layer of a conventional capacitor 12. Significantly, by utilizing the HEMT 2DEG in lieu of a base metal layer for the capacitor 18, the processing steps associated with masking and depositing a base metal layer are obviated. Furthermore, in this embodiment, two passivation layers are deposited in the fabrication of the HEMT 10. At least the second passivation layer is additionally utilized as the dielectric layer separating the conductive features (e.g., metal layers in the prior art) of the capacitor 18.

As FIG. 3 shows, the GaN HEMT 10 comprises at least a substrate, an optional semiconductor epitaxial nucleation layer, a semiconductor epitaxial channel layer, and a semiconductor epitaxial barrier layer (forming a 2DEG in the channel layer at the heterojunction), with source, gate, and drain contacts formed over the barrier layer. The channel and barrier layers may, in general, comprise any semiconductor material. Embodiments of the present invention are particularly suited for use on Group III nitride layers. Techniques for epitaxial growth of Group III nitrides have been described in, for example, U.S. Pat. Nos. 5,210,051; 5,393,993; 5,523,589; and 5,292,501.

The substrate may be formed, for example, from sapphire ($Al_2O_3$), silicon carbide (SiC), gallium nitride (GaN), silicon (Si), or other suitable material. Silicon carbide has a closer crystal lattice match to Group III nitrides than sapphire, and results in Group III nitride films of higher quality. Silicon carbide also has a very high thermal conductivity so that the total output power of Group III nitride devices on a silicon carbide substrate is not limited by the thermal dissipation of the substrate. Also, the availability of silicon carbide substrates provides the capacity for device isolation and reduced parasitic capacitance that make commercial devices possible. Silicon carbide substrates are available from Cree, Inc., of Durham, N.C. and methods for producing them are set forth in the scientific literature as well as in a U.S. Pat. Nos. Re. 34,861; 4,946,547; 5,200,022; and 6,218,680.

A nucleation layer may optionally be included on the substrate, to reduce the lattice mismatch between SiC in the substrate and the channel layer. The nucleation, channel, and barrier layers in the HEMT 10 are preferably formed of Group III nitrides. Group III nitrides refer to semiconductor alloys formed between nitrogen and elements in the conventional Group III of the periodic table (group 13 under International Union of Pure and Applied Chemistry, IUPAC, naming convention)—such as aluminum (Al), Gallium (Ga), and Indium (In). A general formula that encompasses binary, ternary, and quaternary Group III nitride alloys is $Al_xIn_yGa_{1-x-y}N$, where $0<=x<=1$ and $0<=y<=1$.

In one embodiment, the nucleation layer may be formed from AlN, and may be up to about 1000 Å thick. The nucleation layer can be formed using any known method, such as Metal Organic Chemical Vapor Deposition (MOCVD), Hydride Vapor Phase Epitaxy (HVPE), or Molecular Beam Epitaxy (MBE). Methods of depositing a nucleation layer on a silicon carbide substrate are set forth in U.S. Pat. Nos. 5,393,993; 5,523,589; and 5,739,554.

A channel layer is deposited over the nucleation layer, or if it is not present, over the substrate. The channel layer extends beyond the area required for formation of the HEMT 10, and into an area where the capacitor 18 will be formed. In one embodiment, the channel layer comprises GaN, and is in the range of 0.5-20 nm thick. The channel layer can be fabricated by the same methods as the nucleation layer. Techniques for epitaxial growth of Group III nitrides have been described in, for example, U.S. Pat. Nos. 5,210,051; 5,393,993; 5,523,589; and 5,292,501.

The barrier layer is deposited directly on the channel layer (over both the HEMT 10 region and the capacitor 18 region), forming a heterojunction in the channel layer at their interface. In one embodiment, the barrier layer comprises AlGaN. In one embodiment, the barrier layer has a thickness of about 10 Å to about 100 Å. The difference in bandgaps between the (larger bandgap) material in the barrier layer and the (smaller bandgap) material in the channel layer, as well as the greater electron affinity of the channel layer material, cause a 2DEG to form in the channel layer, at the heterojunction. This 2DEG forms the channel of the HEMT 10, and additionally the conductivity conventionally provided by a base metal layer of the capacitor 18. Additionally, one or more alloyed elements (e.g., Al) in the barrier layer may create a piezoelectric charge that drives electrons into the 2DEG, increasing its carrier density and mobility, thus increasing the transconductance of the HEMT 10 and the capacitance of the capacitor 18. In one embodiment, the barrier layer is doped with an n-type dopant (e.g., Si), and the alloy concentration may be graded along its thickness.

As mentioned above, the channel layer and barrier layer deposited to form the HEMT 10 are extended beyond the HEMT 10 active area. The heterojunction between these semiconductor epitaxial layers forms a highly conduction 2DEG region, by operation of the differences in material bandgaps, as explained above. This conductive region is utilized, according to embodiments of the present invention, in lieu of the base metal layer of a conventional capacitor 18.

Ohmic contacts may optionally be formed in the barrier layer, at the site of source and drain contacts of the HEMT 10. These may be formed by doping the barrier layer with one or more of Al, Si, TI, Ni Pt, Ta Au, and Mo. The doping may be in a thickness ranging from 0.0005 to 1 microns.

As part of the fabrication of the HEMT 10, a passivation layer is deposited over the barrier layer. According to the embodiment of FIG. 3, the passivation layer (like the channel and barrier layers) is extended past the active area of the HEMT 10, and into the area where the capacitor 18 is formed. The passivation layer is etched away, exposing areas on the barrier layer for the source, gate, and drain contacts of the HEMT 10, as well as at least one area in the region where the capacitor 18 is formed. The passivation layer may be formed, for example, from Silicon Nitride, Silicon, Oxide, or any material with a high dielectric constant (known in the art as a high-K dielectric).

An isolation step isolates the HEMT channel from other structures, allowing higher performance and greater control of the HEMT 10. The isolation step also electrically isolates the bottom electrode—in this case, the 2DEG at the heterojunction of channel and barrier layers—from other structures and circuits.

In a gate formation step, the gate contact of the HEMT 10 is formed. This can be used to add surface area to the capacitor 18, by using at least two passivation layers. For example, the gate etch can be used to add contour and surface area to the passivation, in effect adding capacitance.

A metallization layer creates the source, gate, and drain contacts of the HEMT 10. These contacts are formed in two steps. First, as described above, a trench is opened in the passivation layer to expose the barrier layer surface. A metal layer is then deposited over the trench to form a Schottky contact to the barrier layer surface. By oversizing the metal pattern, a "T" shaped contact may be formed. In one embodiment, the first and second capacitor contacts are formed in the same metallization step. A first capacitor contact may be formed over the etched area of the passivation layer, where the metal extended to, and forms an electrically conductive contact with, the barrier layer. The second capacitor contact may be formed over an area of the passivation layer that has not been etched, whereby it is separated from the barrier layer (and underlying 2DEG) by the dielectric passivation layer. The metal contacts may be formed using any suitable material, such as Ni or Au.

In some embodiments, a second passivation layer (not shown) may be deposited over the first passivation layer, prior to the formation of the capacitor contacts. This step may be required, for example to isolate the gate contact from a field plate. In these embodiments, the second passivation layer may add an additional dielectric thickness to the capacitor 18, which will decrease capacitance density. This construction may be preferred in high voltage applications, as it increases the breakdown voltage, hence increasing the capacitor lifetime in high voltage applications. The second passivation layer may be formed from Silicon Nitride ($Si_3N_4$), Silicon Oxide ($SiO_2$), or any suitable high-K dielectric material. The second passivation layer must be etched in the same area of the capacitor 18 as the first passivation layer, exposing the barrier layer for electrical contact with one capacitor contact to be deposited later.

Optionally, a field plate may be formed over the HEMT 10 gate contact (not shown in FIG. 3). Field plates are a known technique to improve the performance of Field Effect Transistor (FET) devices under high electric field operation. Field plates address the large electric field that arises in the gate-drain access region during normal operation of the FET. Devices operating with high electric fields have been known to suffer breakdown voltages, trapping effects, reduced reliability—all of which are at least partially alleviated by field plates.

Field plating relies on the vertical depletion of the FET device active region, which enables larger extensions of the horizontal depletion region. This results in a lower electric field in the device active region for a given bias voltage, alleviating at least some of the detrimental effects of operating the FET device at a high electric field. Additionally, a field plate positioned in the gate drain access region has the additional capability of modulating the device active region. This decreases surface traps effects, which impair FET device operation under large RF signals. Methods of fabricating field plates on FET devices, and in particular on Group III nitride HEMT devices, are described in U.S. Pat. No. 7,812,369.

U.S. Pat. No. 7,812,369 describes the formation of a field plate, isolated from the barrier layer of a Group III nitride HEMT, at least partially overlaying the gate contact, and extending over some (but less than all) of the distance from the gate contact to the drain contact. The field plate is electrically connected to the source contact. This arrangement reduces the peak electric field in the HEMT device, resulting in increased breakdown voltage and reduced trapping, reduced leakage current, and enhanced reliability. Furthermore, the shielding effect of a source-connected field plate reduces the gate-to-drain capacitance $C_{gd}$, which enhances input-output isolation.

In an embodiment employing a second passivation layer, the two capacitor contacts may be formed over the second passivation layer in the same metallization step as the field plate formation. Alternatively, the capacitor contacts may be formed in a separate processing step. This metal layer is the main conductive layer for interconnections between components on the IC, and for bond pads to connect to packaging leads. As described above, one of the capacitor contacts extends through the etched passivation layer(s) to form electrically conductive contact with the barrier layer; the second capacitor contact is formed over the passivation layer(s). The contacts are preferably metal, which may be deposited e.g. by evaporation. Suitable metals include Ti, Si, ZSi, Ni, Au, Al, Ta, Mo, TiN, WSiN, Pd, and Pt. The contacts can be of the same or different metal layers. Methods of forming ohmic contacts on doped Group III nitride semiconductor devices are set forth in U.S. Pat. Nos. 9,318,594 and 9,548,206.

In either of the embodiments described above—that is, whether the capacitor contacts are formed over a first passivation layer (as depicted in FIG. 3), or are formed over a second passivation layer—the capacitor 18 employs the 2DEG of the channel/barrier layer heterojunction in lieu of a base metal layer. That is, the 2DEG electrically extends the first capacitor contact to beneath the second capacitor contact, with one or more dielectric layers separating the two, hence forming a capacitor 18. In this manner, separate metal contacts, separated by a dielectric, need not be formed (with the extensive concomitant processing steps, and known risk of defects in the base metal layer). Rather, the two metal contacts of the capacitor 18 may be formed at the same level, in the same metallization processing step, and the 2DEG utilized in lieu of the base metal layer of a conventional capacitor 12 (as shown in FIG. 1). Furthermore, as depicted in FIG. 3, the passivation layer normally deposited as part of the formation of the HEMT 10 may also provide the dielectric layer for the capacitor 18. This sharing of structural features between the HEMT 10 and the capacitor 18 allow for the co-forming of HEMT 10 and capacitor 16 components on the same IC, utilizing many of the same processing steps, and obviating several additional steps conventionally required to form a capacitor 12.

Figure 4:
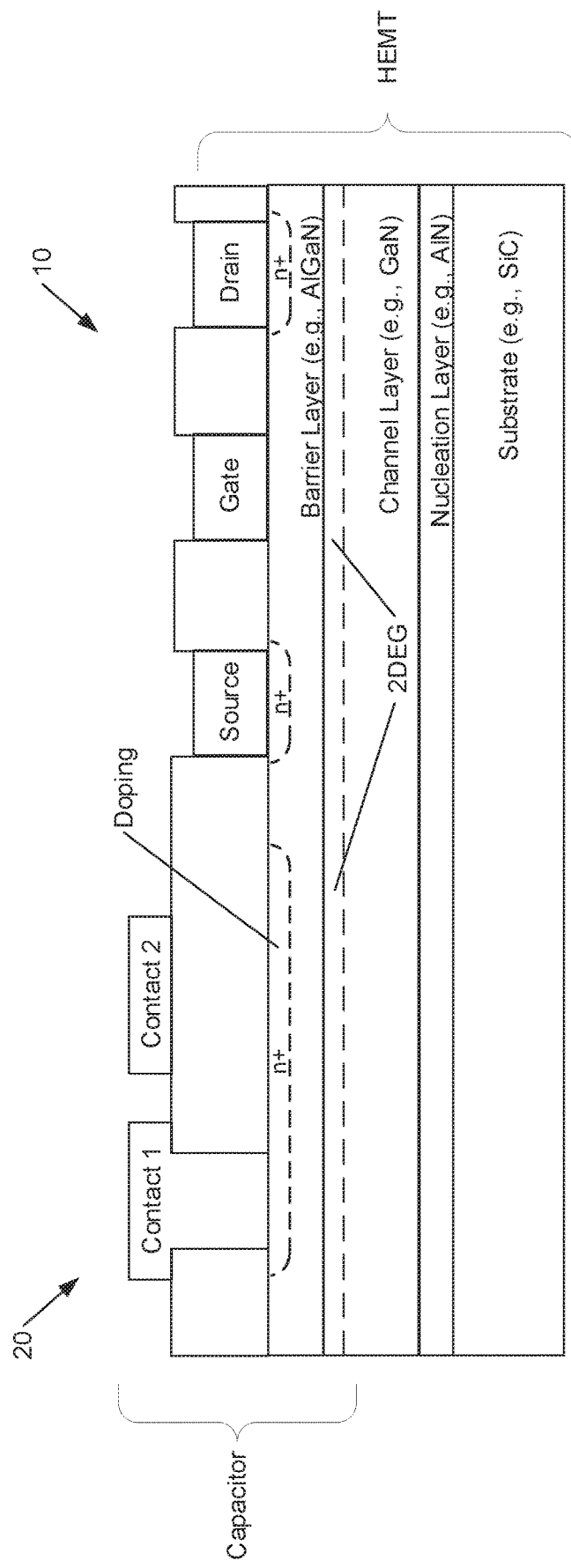
FIG. 4 is a section view of an HEMT and capacitor co-formed on an integrated circuit, with a doped region of a semiconductor epitaxial layer enhancing the conductivity of the 2DEG.

FIG. 4 depicts a variation of the co-formed HEMT 10 and capacitor 20, in which electrical conductivity of the 2DEG in the capacitor 20 is enhanced by doping the barrier layer with an n-type dopant to increase its conductivity. It is well known to dope isolated regions of the barrier layer, beneath the site of source and drain contacts, as shown in FIGS. 3 and 4, to enhance the electrical connection between the source and drain contacts and the HEMT channel (formed by the 2DEG). Similarly, a region of the barrier layer where the capacitor 20 is formed may be doped to increase the conductivity of the 2DEG and form a conductive region of the barrier layer, which adds to the conductivity functioning in lieu of a conventional base metal layer of the capacitor 20.

The conductive region may be formed by doping the epitaxial layer with any n+ type dopant, and to any degree necessary to create sufficient conductivity for the conductive region to function as the base metal layer of a capacitor 20. Si and Ge are common n+ type dopants, although other n+ type dopants or combinations of dopants are possible. The doping can be up to $1E18$ cm$^2$, and is preferably about $5E15$ per cm$^2$. The doping density (per cm$^2$) is more important than the exact thickness of the doped region. In one embodiment, the doping density is at least $2.5E20$ per cm$^2$. In one embodiment, the doping is confined to a very thin layer, about 1 to 2 nm in thickness. In some embodiments, the doping concentration of the region may be graded.

Doping of semiconductor materials may be performed during and/or after material growth. Impurity atoms may be categorized as n-type or p-type depending on whether the implanted ions act as donors (which increase the number of electrons) or acceptors (which increase the number of holes), respectively, in the doped material. The resulting material may be characterized as n-type or p-type depending on the predominant type of dopants in the material.

Ion implantation is a well-known method of doping a semiconductor layer with impurities. In an ion implantation process, ionized impurity atoms are accelerated under high vacuum through an electric field towards the target layer, where they become implanted. The number of ions directed at a target layer is referred to as the dose, which is typically expressed in ions/cm2. The ions are accelerated at an energy level, typically expressed in electron-volts (eV). The distribution of ions in the implanted layer depends on the dose and energy of the implant, sometimes referred to as the implant conditions, as well as the type of ions implanted, the type of material the ions are implanted into, the angle of the implants, and other factors. The implanted ions typically form a concentration distribution that has a peak concentration at a particular depth (i.e., the "implant range").

Ion implantation is useful for selective doping of crystalline material in order to form desired regions in the material, such as p-n junctions, highly conductive contact regions, field spreading regions, etc. Typically, after impurities are implanted into a semiconductor layer, it is desirable to anneal the implanted impurities at a high temperature, i.e., a so-called activation anneal. An activation anneal may repair damage caused by the implantation of high-energy ions into the semiconductor lattice. Implant damage may include, for example, broken and/or rearranged chemical bonds within the semiconductor lattice. The activation anneal may also assist implanted impurity ions in finding a suitable site in the crystal lattice at which the ions may appropriately act as acceptors and/or donors.

The doped regions may be formed as a region of n+ implants in the Group III nitride epitaxial layer. Impurity ions of, e.g., silicon, sulfur, or oxygen are implanted into the epitaxial layer such that at least a portion of the implanted ions come to rest within the doped region. The implant process may include multiple implant steps to provide a net profile of implanted dopants. For example, the implant process may include a first implant step performed under a first set of implant conditions and a subsequent implant step performed under a second set of implant conditions. More than two implant steps may be performed. In some embodiments, the implants may be performed at room temperature. The implant energies and dose may be selected to provide an implant profile that achieves a desired conductivity.

After formation of the doped region, the implants may be activated by an activation anneal. The activation anneal may be performed in an inert atmosphere including, for example, N2 and/or Ar. The activation anneal may be performed at a temperature sufficient to activate the implanted dopant ions but less than a temperature at which the semiconductor layer deteriorates. In some embodiments, the activation anneal may be performed at a temperature of about 1000° C. to about 1300° C. The activation anneal may be performed in-situ and/or in a separate annealing chamber. The activation anneal may be performed for at least about 30 seconds or more, depending on the anneal temperature. For example, a rapid thermal anneal (RTA) at about 1300° C. may be performed for about 30 seconds, while a furnace anneal at about 1000° C. may be performed for about 30 minutes. The particular selection of activation times and temperatures may vary depending on the type of materials involved and the particular implant conditions employed. In particular embodiments, the anneal time may be in the range of about 30 seconds to about 30 minutes. Methods of doping GaN are set forth in U.S. Pat. No. 9,318,594.

The doped region can also be formed in other ways, such as doping during epitaxial growth of the layer, if the area is exposed via etching and regrown to the appropriate dopants during epitaxial growth. Si and Ge are common n-type dopants. Preferably, the doping concentration is as high as possible without introducing crystal defects. For example, in one embodiment, 1e18 to 1e20/cm$^3$ is the desired range of doping concentration.

Using the 2DEG of the HEMT 10 in lieu of the lower metal layer of a capacitor 18, 20—whether the barrier layer is doped (FIG. 4) or not (FIG. 3)—is only one example of sharing structural features between the HEMT 10 and capacitor 18, 20. For example, FIGS. 5A-5D depict four different possible forms of contact between a capacitor base layer contact (Contact 1) and the conductive lower layer shared with the HEMT.

Figure 5A:
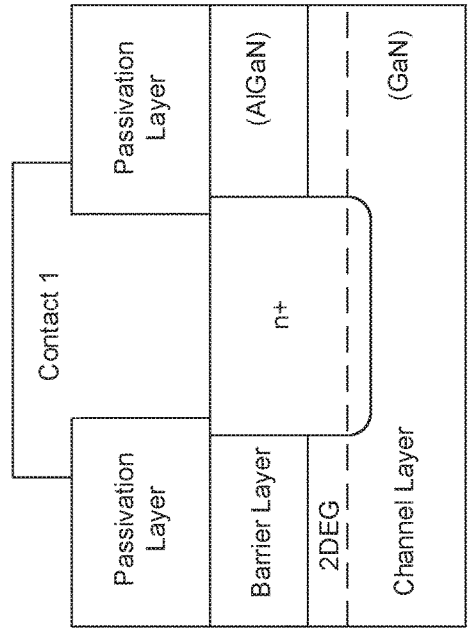
FIGS. 5A-5D are section views depicting various capacitor base layer contact structures.

FIG. 5A (which corresponds to FIG. 3) depicts the capacitor base layer contact making physical and electrical contact with the barrier epitaxial layer of the HEMT, through an etched portion of the passivation layer (which serves as the capacitor dielectric layer).

Figure 5B:
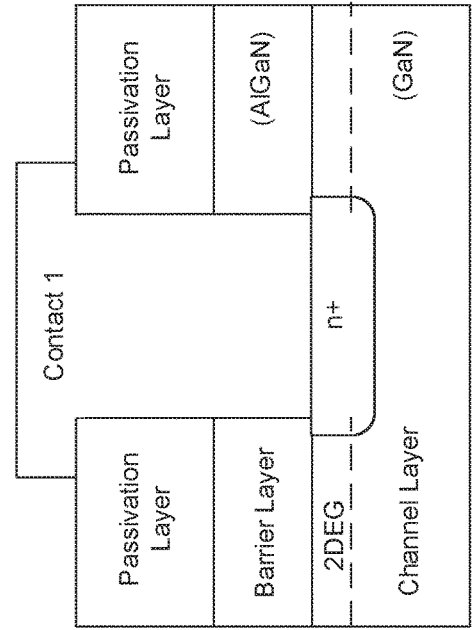

FIG. 5B (which is similar to FIG. 4) also depicts the capacitor base layer contact making physical and electrical contact with the barrier epitaxial layer of the HEMT. However, in this embodiment, the barrier layer and part of the channel layer are doped with an n-type dopant to enhance conductivity. Note that, unlike the relatively shallow doped region of FIG. 4, in this embodiment the doping extends into the channel layer, and includes the 2DEG formed at the heterojunction of the channel and barrier layers.

Figure 5C:
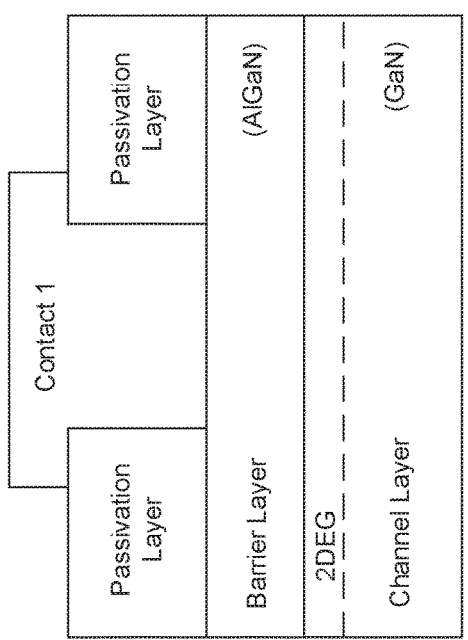

FIG. 5C depicts another embodiment, wherein the barrier layer is etched, as well as the passivation layer, exposing the channel layer. The capacitor base layer contact is then formed to extend down to, and make physical and electrical contact with, the channel epitaxial layer of the HEMT. Because the barrier layer was removed to allow for the contact, no 2DEG forms over this region of the channel layer, as there is no heterojunction with the requisite difference in bandgap. In this case, the channel layer itself forms a conductive area under the passivation (dielectric) layer, in lieu of a conventional capacitor base metal layer.

Figure 5D:
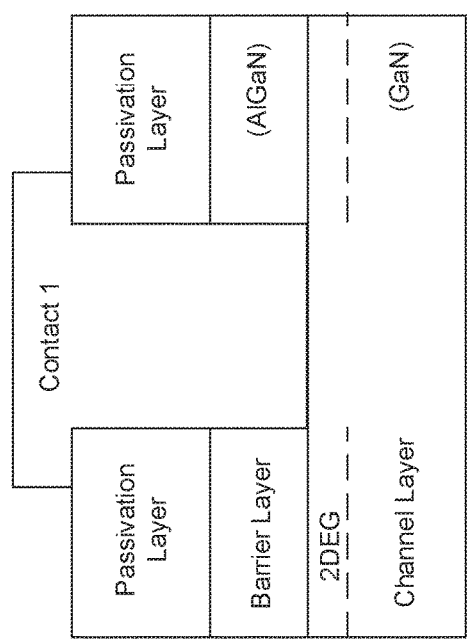

FIG. 5D depicts yet another embodiment, in which the capacitor base layer contact extends to the HEMT channel layer. In this embodiment, a region of the channel layer under the contact is doped with an n-type dopant to enhance conductivity.

Figure 6:
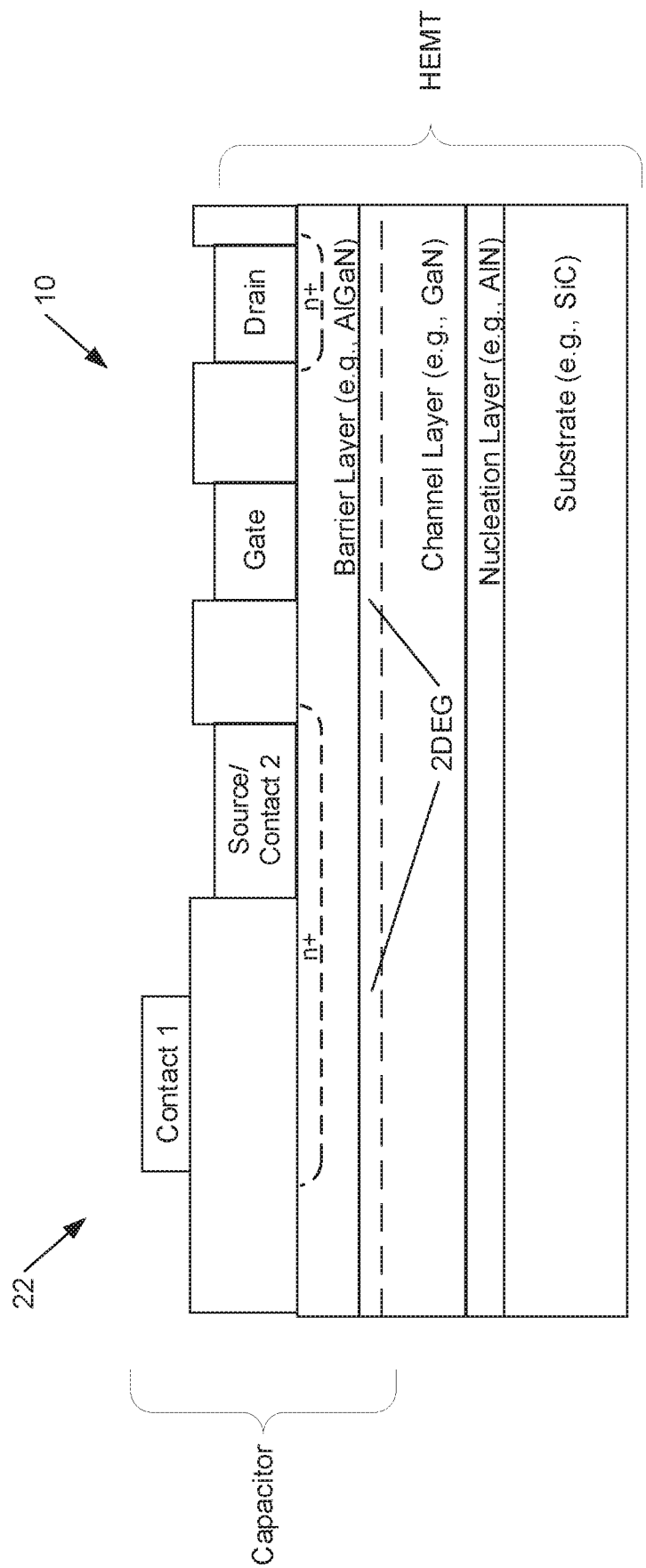
FIG. 6 is a section view of an HEMT and capacitor co-formed on an integrated circuit, and sharing a source and base layer contact.

FIG. 6 depicts yet another option for sharing structural features between a HEMT 10 and a capacitor 22. In this case, only one dedicated capacitor contact (Contact 1) is formed, over a passivation layer, which forms the dielectric for the capacitor 22. The capacitor base layer contact is the same metal contact as the HEMT source contact. This contact makes physical and electrical contact with the barrier layer (which, in this case, has enhanced conductivity due to selective doping). A single metal contact, which functions both as the HEMT source contact and the capacitor base layer contact, provides electrical conductivity to the HEMT 2DEG formed in the channel layer. In embodiments where a capacitor terminal connects to a HEMT source terminal, the embodiment of FIG. 6 saves not only the etching and preparation required to form a dedicated capacitor base layer contact, but additionally saves the wiring layer metallization necessary to other make electrical connection between the two components, with the concomitant reduction in parasitic capacitance and other wiring effects.

Figure 7:
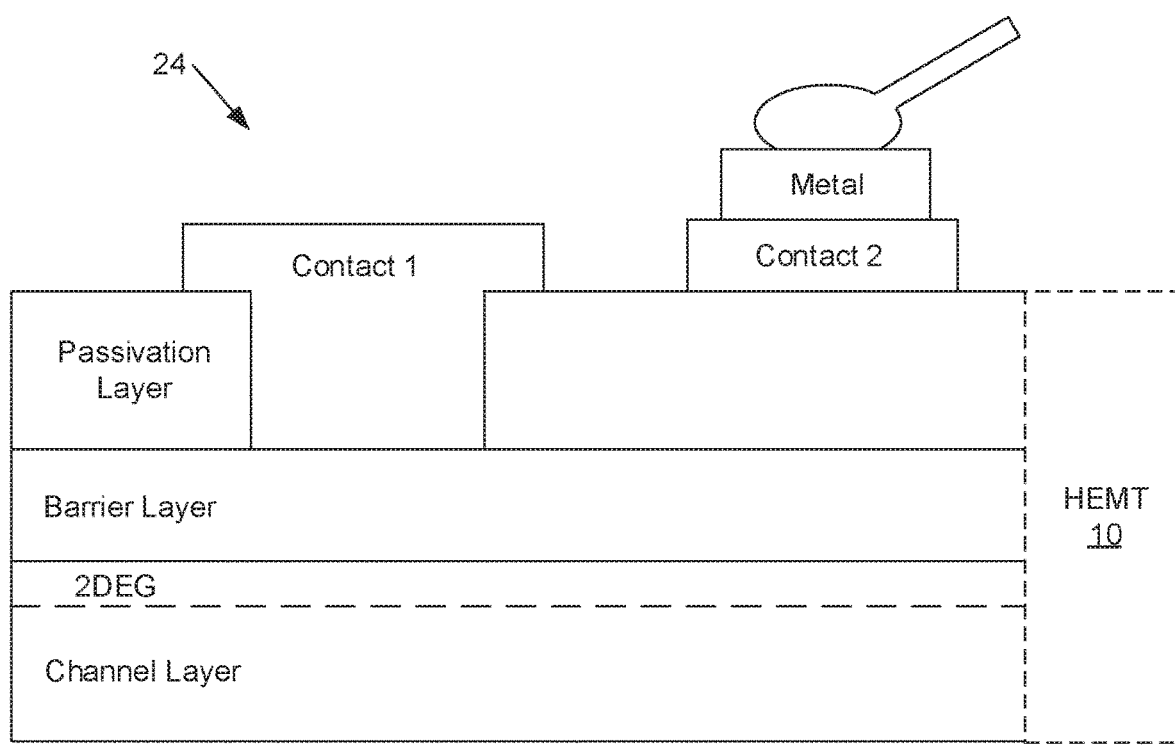
FIG. 7 is a section view of an HEMT and capacitor co-formed on an integrated circuit, utilizing a 2DEG as a conductive region of the capacitor, showing a bonding pad and bondwire.

FIG. 7 depicts a capacitor 24 sharing the structural feature of a HEMT 2DEG as a base conductive layer, with the addition of a bond wire metallization pad formed over the second capacitor contact (for clarity, details of the HEMT 10 are not shown). The bond wire may be formed of Au, Al, or other suitable material, as known in the art. In another embodiment, the additional metallization step may not be required, and the bondwire may bond directly to the Contact 2 of the capacitor 24.

Figure 8:
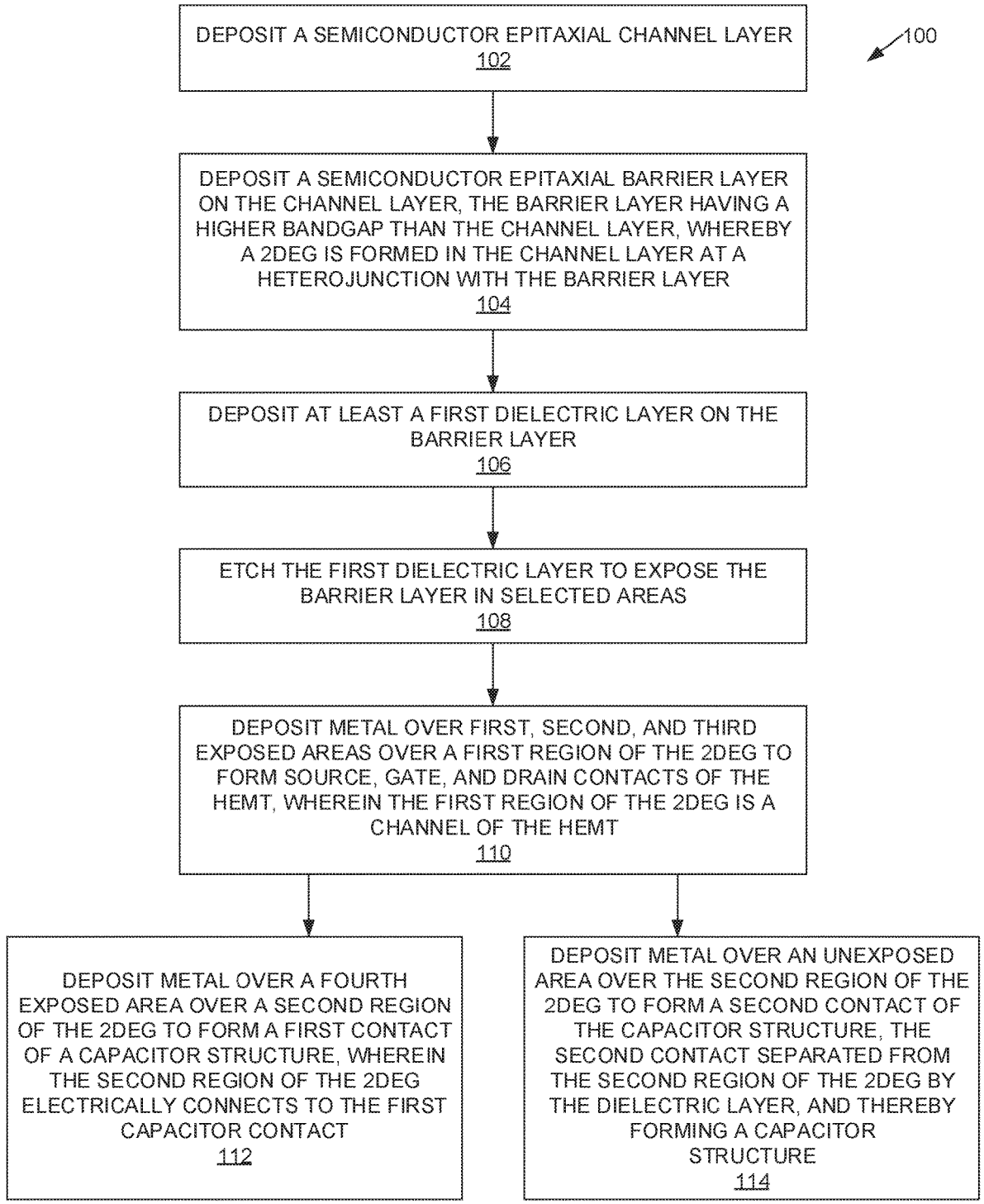
FIG. 8 is a flow diagram of a method of co-forming a HEMT and a capacitor on an integrated circuit.

FIG. 8 depicts the steps in a method 100 of co-forming a HEMT 10 and a capacitor 14, 18, 20, 24 on an integrated circuit, wherein one or more structural features of the two components are shared. In this case, the 2DEG of a HEMT 10 also functions as the base layer of a capacitor 14, 18, 20, 24. Additionally, a single dielectric layer formation step forms both a passivation layer of the HEMT 10 and a dielectric layer of the capacitor 14, 18, 20, 24.

A semiconductor epitaxial channel layer is deposited, e.g., on a substrate, nucleation layer, or underlying semiconductor epitaxial layer (block 102). A semiconductor epitaxial barrier layer is deposited on the channel layer (block 104). The barrier layer has a higher bandgap than the channel layer, whereby a 2DEG is formed in the channel layer at a heterojunction with the barrier layer. At least a first dielectric layer is deposited on the barrier layer (block 106). The first dielectric layer is etched to expose the barrier layer in selected areas (block 108). Metal is deposited over first, second, and third exposed areas over a first region of the 2DEG to form source, gate, and drain contacts of the HEMT, wherein the first region of the 2DEG is a channel of the HEMT 10 (block 110). Metal is deposited over a fourth exposed area over a second region of the 2DEG to form a first contact of a capacitor 14, 18, 20, 24, wherein the second region of the 2DEG electrically connects to the first capacitor contact (block 112). Metal is deposited over an unexposed area of the dielectric layer over the second region of the 2DEG to form a second contact of the capacitor 14, 18, 20, 24. The second contact is separated from the second region of the 2DEG by the dielectric layer, and thereby forms a capacitor 14, 18, 20, 24 (block 114). As FIG. 8 indicates, steps 112 and 114 may occur in the same metallization process step, significantly simplifying construction of the capacitor 14, 18, 20, 24 over techniques known in the prior art.

Figure 9:
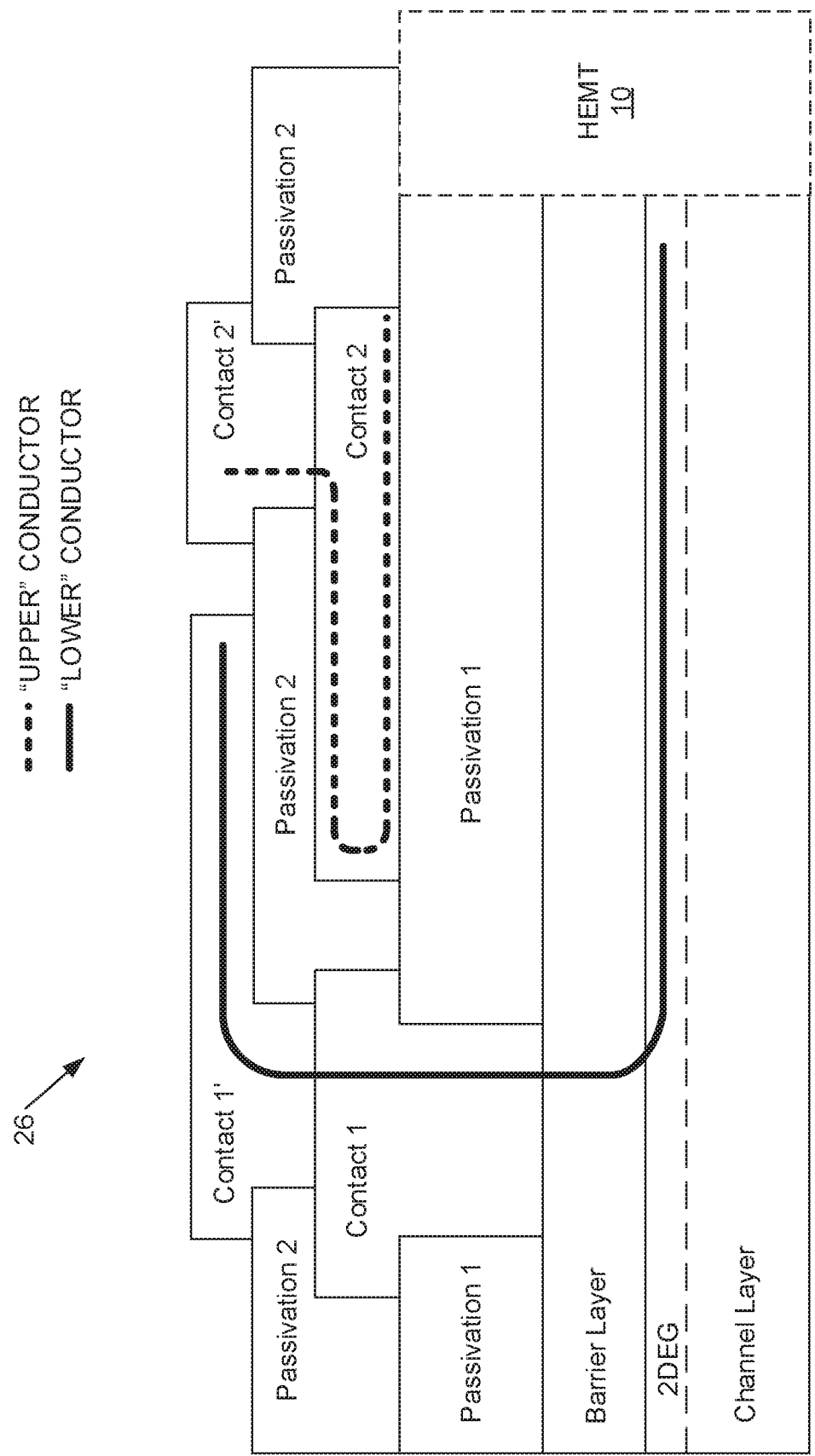
FIG. 9 is a section diagram of a folded capacitor comprising a conventional capacitor fabricated over an integrated capacitor structure that shares HEMT features.

In one embodiment, a "folded" capacitator 26 comprises a combination of an inventive "integrated" capacitor structure (so called because it shares features with, and is hence integrated with, a HEMT 10), and a conventional capacitor structure, to increase the capacitive density while retaining the silicon footprint of a conventional capacitor. FIG. 9 depicts such a folded capacitor 24.

Initially, an integrated capacitor structure is formed as described above. The epitaxial layers of a HEMT 10 are extended beyond the HEMT 10 area, and the 2DEG (or other HEMT 10 structure, such as a doped epitaxial layer) forms the base layer conductor of an integrated capacitor structure. A first passivation layer is formed over the barrier layer, and etched away in one place to provide access to the epitaxial layers. Metal contacts, labeled Contact 1 and Contact 2 in FIG. 9, are formed by a metallization process; these form the contacts of the integrated capacitor. In particular, Contact 1 is the base layer contact, and Contact 2—separated from the conductive 2DEG by the first (dielectric) passivation layer—is the upper layer contact of the integrated capacitor.

A second passivation layer is then deposited over both Contact 1 and Contact 2, and etched away to expose both of these contacts. Note that Contact 2 extends laterally over a greater area than necessary to provide a connection point. According to one embodiment, this metal contact provides what would normally be considered the base layer of a conventional capacitor, formed over the integrated capacitor. Contact 2' is deposited over the second passivation layer, and forms electrical connectivity with Contact 2. Similarly, Contact 1' is also deposited over the second passivation layer at the location of the etching to expose Contact 1, and forms electrical connectivity with Contact 1. Similarly to Contact 2, Contact 1' extends laterally over a greater area than necessary to provide a connection point. In particular, Contact 1' at least partially overlies Contact 2—separated by the second (dielectric) passivation layer. The mutually facing portions of metal deposits Contact 2 and Contact 1'—separated by a dielectric (the second passivation layer)—form the electrical structure of a conventional capacitor.

Together, the integrated capacitor structure and the overlying conventional capacitor structure form a "folded" capacitor 26. As depicted by the bold dashed line in FIG. 9, the "upper" conductor is formed by Contact 2' and Contact 2. As depicted by the bold solid line in FIG. 9, the base or "lower" conductor is formed by Contact 1', Contact 1, and the 2DEG (or other epitaxial structure) of the HEMT 10. At all points, these two conductive paths are separated by dielectric material (parts of the Passivation 2 and Passivation 1 layers). Hence, the folded capacitor 26 has a horizontally folded-over, or "C" shape. Of course, in this context the terms "upper" and "lower" are for reference only, as the spatial relationship implied is true only with respect to the integrated capacitor structure (and is the inverse for the conventional capacitor structure).

Due to this stacking of a conventional capacitor structure over an integrated capacitor structure, the capacitive density of the folded capacitor 26 is increased, without occupying a greater silicon footprint than would be required by a conventional capacitor. Furthermore, the advantages of sharing the 2DEG (or other epitaxial structure) of the HEMT 10 for the integrated capacitor structure accrue to the folded capacitor 26, in that an entire metallization layer is avoided.

Embodiments of the present invention present numerous advantages over integrated circuit capacitors 12 of the prior art. Particularly as applied to Group III nitride HEMTs 10, capacitors 14, 18, 20, 22, 24, 26 utilizing a conductive 2DEG and/or doped or undoped epitaxial layer as a base conductive layer avoid the deleterious effects of evaporative deposition of a base metal layer, such as Gold spits and rough morphology, which can reduce yield. Additionally, sharing structural features with a HEMT 10 may obviate one or numerous process steps, such as those associated with fabricating a base metal layer, thus reducing cost and complexity, and also increasing yield. In some embodiments, forming a conventional capacitor structure over an inventive integrated capacitor structure increases the capacity density, without increasing the silicon footprint.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An integrated capacitor and High Electron Mobility Transistor (HEMT) co-formed on an integrated circuit, comprising:
   a first capacitor comprising at least the structural features of
      a base conductive layer;
      a dielectric layer over the base conductive layer; and
      an upper conductive layer over the dielectric layer; and
   a HEMT comprising at least the structural features of
      a channel epitaxial layer;
      a barrier epitaxial layer on the channel layer, the barrier layer having a higher bandgap than the channel layer, whereby a Two-Dimensional Electron Gas (2DEG) is formed in the channel epitaxial layer at a heterojunction with the barrier layer;
      a passivation layer on the barrier layer, the passivation layer selectively removed to expose selected portions of the barrier layer;
      first, second, and third ohmic contacts formed over three of the exposed portions of the barrier layer, wherein the first, second, and third ohmic contacts are source, gate, and drain contacts of the HEMT, and wherein a first region of the 2DEG is a channel of the HEMT;
   wherein the first capacitor and the HEMT share at least the barrier epitaxial layer, and wherein the first capacitor and the HEMT are electrically connected.

2. The integrated capacitor and HEMT of claim 1 wherein at least the channel epitaxial layer is formed from a Group III nitride.

3. The integrated capacitor and HEMT of claim 2 wherein the base conductive layer of the first capacitor comprises the 2DEG of the HEMT.

4. The integrated capacitor and HEMT of claim 3 wherein a base layer contact of the first capacitor is deposited over, and electrically connected to, the barrier epitaxial layer of the HEMT.

5. The integrated capacitor and HEMT of claim 4 wherein at least the barrier epitaxial layer under the first capacitor base layer contact is doped with an n-type dopant to enhance electrical conductivity.

6. The integrated capacitor and HEMT of claim 5 wherein the barrier epitaxial layer under the first capacitor base layer contact is doped with Si ions.

7. The integrated capacitor and HEMT of claim 3 wherein a region of the barrier layer is removed; and a base layer contact of the first capacitor is deposited over, and electrically connected to, the channel epitaxial layer of the HEMT in the region where the barrier layer was removed.

8. The integrated capacitor and HEMT of claim 7 wherein the channel epitaxial layer under the first capacitor base layer contact is doped with an n-type dopant to enhance electrical conductivity.

9. The integrated capacitor and HEMT of claim 8 wherein the channel epitaxial layer under the first capacitor base layer contact is doped with Si ions.

10. The integrated capacitor and HEMT of claim 2 wherein the dielectric layer of the first capacitor is a passivation layer of the HEMT.

11. The integrated capacitor and HEMT of claim 2 wherein at least one of the upper conductive layer of the first capacitor and a base layer contact of the first capacitor is the source or drain contact of the HEMT.

12. The integrated capacitor and HEMT of claim 2 further comprising a second capacitor comprising:
   a base conductive layer;
   a dielectric layer over the base conductive layer; and
   an upper conductive layer over the dielectric layer;
   wherein the second capacitor does not share a structural feature with the HEMT.

13. The integrated capacitor and HEMT of claim 12 wherein the base conductive layer of the second capacitor is the upper conductive layer of the first capacitor.

14. The integrated capacitor and HEMT of claim 2 wherein the first capacitor is part of a Radio Frequency filter associated with the HEMT.

15. The integrated capacitor and HEMT of claim 2 wherein the first capacitor is part of a harmonic termination circuit associated with the HEMT.

16. A High Electron Mobility Transistor (HEMT) and a capacitor co-formed on an integrated circuit, comprising:
   a channel layer;
   a barrier layer on the channel layer, the barrier layer having a higher bandgap than the channel layer, whereby a Two-Dimensional Electron Gas (2DEG) is formed in the channel layer at a heterojunction with the barrier layer;
   a first dielectric layer on the barrier layer, the first dielectric layer selectively removed to expose selected portions of the barrier layer;
   first, second, and third ohmic contacts formed over three of the exposed portions of the barrier layer, wherein the first, second, and third ohmic contacts are source, gate, and drain contacts of the HEMT, and wherein a first region of the 2DEG is a channel of the HEMT;
   a fourth ohmic contact formed over an exposed region of the barrier layer, wherein the fourth ohmic contact and a second region of the 2DEG are a first terminal of a first capacitor structure, wherein the first and second regions of the 2DEG are electrically connected; and
   a fifth ohmic contact formed over a non-exposed region of the dielectric layer over the second region of the 2DEG, wherein the fifth ohmic contact is a second terminal of the first capacitor structure.

17. The HEMT and capacitor of claim 16 wherein the channel layer is formed from a Group III nitride.

18. The HEMT and capacitor of claim 16 wherein the barrier layer over the second region of the 2DEG is doped with an n-type dopant to enhance electrical conductivity.

19. The HEMT and capacitor of claim 18 wherein the barrier layer over the second region of the 2DEG is doped with Si ions.

20. The HEMT and capacitor of claim 16 wherein the fifth ohmic contact extends over an area of the first dielectric layer greater than required for forming a contact, and further comprising:
- a second dielectric layer formed over the fourth and fifth ohmic contacts, and etched to expose at least part of the fourth and fifth ohmic contacts;
- a sixth ohmic contact formed over an exposed region of the second dielectric layer over the fifth ohmic contact, and making electrical contact with the fifth ohmic contact; and
- a seventh ohmic contact formed over an exposed region of the second dielectric layer over the fourth ohmic contact, and making electrical contact with the fourth ohmic contact, wherein the seventh contact extends over an area of the second dielectric layer at least partially overlying the fifth ohmic contact, whereby the fifth and seventh ohmic contacts and the intervening second dielectric layer form a second capacitor structure electrically connected to the first capacitor structure.

21. A method of co-forming a High Electron Mobility Transistor (HEMT) and a capacitor on an integrated circuit, comprising:
- depositing a semiconductor epitaxial channel layer;
- depositing a semiconductor epitaxial barrier layer on the channel layer, the barrier layer having a higher bandgap than the channel layer, whereby a Two-Dimensional Electron Gas (2DEG) is formed in the channel layer at a heterojunction with the barrier layer;
- depositing at least a first dielectric layer on the barrier layer;
- etching the first dielectric layer to expose the barrier layer in selected areas;
- depositing metal over first, second, and third exposed areas over a first region of the 2DEG to form source, gate, and drain contacts of the HEMT wherein the first region of the 2DEG is a channel of the HEMT;
- depositing metal over a fourth exposed area over a second region of the 2DEG to form a first contact of a first capacitor structure, wherein the second region of the 2DEG electrically connects to the first contact of the first capacitor structure and to the first region of the 2DEG;
- depositing metal over an unexposed area of the first dielectric layer over the second region of the 2DEG to form a second contact of the first capacitor structure, the second contact separated from the second region of the 2DEG by the dielectric layer and thereby forming a capacitor structure.

22. The method of claim 21 further comprising, prior to depositing the first dielectric layer, doping an upper surface of the barrier layer over the second region of the 2DEG with an n-type dopant.

23. The method of claim 22 wherein doping an upper surface of the first semiconductor epitaxial layer comprising doping the first semiconductor epitaxial layer with Si ions.

24. The method of claim 21 wherein depositing a semiconductor epitaxial layer comprises depositing a Group III nitride to form a semiconductor epitaxial layer.

25. The method of claim 21 further comprising:
- depositing a second dielectric layer on the first dielectric layer over at least the first region of the 2DEG; and
- etching the second dielectric layer to expose the barrier layer at least over the fourth exposed area.

26. The method of claim 25 further comprising:
- depositing metal on the second dielectric layer over the gate contact of the HEMT to form a field plate.

27. The method of claim 21 wherein depositing metal over an unexposed area of the first dielectric layer to form a second contact of the first capacitor structure comprises depositing metal over an area of the first dielectric layer greater than required for forming a contact, and further comprising:
- depositing a second dielectric layer over the first dielectric layer and the first and second contacts of the first capacitor structure;
- etching the second dielectric layer to expose the first and second contacts of the first capacitor structure;
- depositing metal over the exposed area over the fifth ohmic contact to form a sixth ohmic contact, the sixth ohmic contact making electrical contact with the fifth ohmic contact;
- depositing metal over the exposed area over the fourth ohmic contact to form a seventh ohmic contact, the seventh ohmic contact making electrical contact with the fourth ohmic contact, wherein the seventh contact extends over an area of the second dielectric layer at least partially overlying the fifth ohmic contact, whereby the fifth and seventh ohmic contacts and the intervening second dielectric layer form a second capacitor structure electrically connected to the first capacitor structure.

28. The method of claim 21 further comprising incorporating the capacitor into a Radio Frequency filter associated with the HEMT.

29. The method of claim 21 further comprising incorporating the capacitor into a harmonic termination circuit associated with the HEMT.

* * * * *